United States Patent
Darabi et al.

(10) Patent No.: US 7,782,152 B2
(45) Date of Patent: Aug. 24, 2010

(54) MONOTONIC FREQUENCY TUNING TECHNIQUE FOR DCXO IN CELLULAR APPLICATIONS

(75) Inventors: Hooman Darabi, Irvine, CA (US); Yuyu Chang, Irvine, CA (US); Zhimin Zhou, Rancho Palos Verdes, CA (US); Morteza Vadipour, Woodland Hills, CA (US)

(73) Assignee: Broadcom Corporation, Irvine, CA (US)

( * ) Notice: Subject to any disclaimer, the term of this patent is extended or adjusted under 35 U.S.C. 154(b) by 42 days.

(21) Appl. No.: 12/241,103

(22) Filed: Sep. 30, 2008

(65) Prior Publication Data

US 2010/0039194 A1 Feb. 18, 2010

Related U.S. Application Data

(60) Provisional application No. 61/089,021, filed on Aug. 14, 2008.

(51) Int. Cl.
*H03B 5/32* (2006.01)

(52) U.S. Cl. .................................. 331/177 V; 331/158

(58) Field of Classification Search ............. 331/116 R, 331/116 FE, 158, 36 C, 177 V, 177 R, 179
See application file for complete search history.

(56) References Cited

U.S. PATENT DOCUMENTS 6,747,522 B2 * 6/2004 Pietruszynski et al. .. 331/177 R
7,280,001 B2 * 10/2007 Maligeorgos et al. ....... 331/158

* cited by examiner

*Primary Examiner*—Robert Pascal
*Assistant Examiner*—Ryan Johnson
(74) *Attorney, Agent, or Firm*—Garlick Harrison & Markison; Holly L. Rudnick

(57) ABSTRACT

A frequency tuning device for use in a crystal oscillator circuit includes a first fine tuning array of capacitors, a second fine tuning array of capacitors and a coarse tuning array of capacitors coupled in parallel to produce a tuning capacitance for tuning the crystal oscillator. The first fine tuning array of capacitors includes a binary weighted switched capacitor network, the second fine tuning array of capacitors includes a thermometer coded switched capacitor network and the coarse tuning array of capacitors includes a binary weighted switched capacitor network with a different unit capacitance value than the first and second fine tuning arrays.

16 Claims, 8 Drawing Sheets

| | | | | | | | | | | | | | | | |
|---|---|---|---|---|---|---|---|---|---|---|---|---|---|---|---|
| 5 | 5 | 5 | 5 | 5 | 7 | 7 | 7 | 7 | 7 | 5 | 5 | 5 | 5 | 5 | |
| 5 | 7 | 7 | 7 | 7 | 7 | 7 | 7 | 7 | 7 | 7 | 7 | 7 | 7 | 5 | |
| 5 | 7 | 6 | 6 | 6 | 6 | 7 | 7 | 7 | 6 | 6 | 6 | 6 | 7 | 5 | |
| 5 | 7 | 6 | 6 | 6 | 6 | 7 | 7 | 7 | 6 | 6 | 6 | 6 | 7 | 5 | |
| 7 | 7 | 6 | 6 | 6 | 6 | 7 | 7 | 7 | 6 | 6 | 6 | 6 | 7 | 7 | |
| 7 | 7 | 6 | 6 | 6 | 6 | 7 | 7 | 7 | 6 | 6 | 6 | 6 | 7 | 7 | |
| 7 | 7 | 7 | 7 | 7 | 4 | 4 | 4 | 4 | 4 | 7 | 7 | 7 | 7 | 7 | |
| 7 | 7 | 7 | 7 | 4 | 3 | 2 | 3 | 1 | 3 | 4 | 7 | 7 | 7 | 7 | |
| 7 | 7 | 7 | 7 | 4 | 3 | 2 | 0 | 2 | 3 | 4 | 7 | 7 | 7 | 7 | |
| 7 | 7 | 7 | 7 | 4 | 3 | 1 | 3 | 2 | 3 | 4 | 7 | 7 | 7 | 7 | |
| 7 | 7 | 7 | 7 | 7 | 4 | 4 | 4 | 4 | 4 | 7 | 7 | 7 | 7 | 7 | |
| 7 | 7 | 6 | 6 | 6 | 6 | 7 | 7 | 7 | 6 | 6 | 6 | 6 | 7 | 7 | |
| 7 | 7 | 6 | 6 | 6 | 6 | 7 | 7 | 7 | 6 | 6 | 6 | 6 | 7 | 7 | |
| 5 | 7 | 6 | 6 | 6 | 6 | 7 | 7 | 7 | 6 | 6 | 6 | 6 | 7 | 5 | |
| 5 | 7 | 6 | 6 | 6 | 6 | 7 | 7 | 7 | 6 | 6 | 6 | 6 | 7 | 5 | |
| 5 | 7 | 7 | 7 | 7 | 7 | 7 | 7 | 7 | 7 | 7 | 7 | 7 | 7 | 5 | |
| 5 | 5 | 5 | 5 | 5 | 7 | 7 | 7 | 7 | 7 | 5 | 5 | 5 | 5 | 5 | |

| 2 | 9 | 14 | 20 | 26 | 22 | 12 | 6 | 3 |
|---|---|----|----|----|----|----|---|---|
| 5 | 17 | 30 | 23 | 31 | 25 | 28 | 18 | 8 |
| 11 | 29 | 19 | 7 | 1 | 10 | 16 | 27 | 15 |
| 21 | 24 | 13 | 4 | 0 | 4 | 13 | 24 | 21 |
| 15 | 27 | 16 | 10 | 1 | 7 | 19 | 29 | 11 |
| 8 | 18 | 28 | 25 | 31 | 23 | 30 | 17 | 5 |
| 3 | 6 | 12 | 22 | 26 | 20 | 14 | 9 | 2 |

| 5 | 5 | 5 | 5 | 5 | 5 | 5 | 5 |
|---|---|---|---|---|---|---|---|
| 5 | 5 | 4 | 4 | 4 | 4 | 5 | 5 |
| 5 | 4 | 3 | 2 | 3 | 1 | 3 | 4 | 5 |
| 5 | 4 | 3 | 2 | 0 | 2 | 3 | 4 | 5 |
| 5 | 4 | 3 | 1 | 3 | 2 | 3 | 4 | 5 |
| 5 | 5 | 4 | 4 | 4 | 4 | 5 | 5 |
| 5 | 5 | 5 | 5 | 5 | 5 | 5 | 5 |

(27)

MONOTONIC FREQUENCY TUNING TECHNIQUE FOR DCXO IN CELLULAR APPLICATIONS

CROSS REFERENCE TO RELATED PATENTS

The present U.S. Utility Patent Application claims priority pursuant to 35 U.S.C. §119(e) to the following U.S. Provisional Patent Application which is hereby incorporated herein by reference in its entirety and made part of the present U.S. Utility Patent Application for all purposes:

U.S. Provisional Application Ser. No. 61/089,021, entitled "MONOTONIC FREQUENCY TUNING TECHNIQUE FOR DCXO IN CELLULAR APPLICATIONS,", filed Aug. 14, 2008, pending.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

1. Technical Field of the Invention

This invention relates generally to crystal oscillator circuits, and in particular, to tuning of crystal oscillator circuits.

2. Description of Related Art

Local oscillator signals used in cellular telecommunications applications must be highly stable. Since crystals, such as quartz, have an extremely high Q, crystal oscillators are often utilized to provide the necessary frequency stability. Typically, quartz crystals are cut and mounted to vibrate best at a desired resonant frequency or an overtone (multiple) of the desired resonant frequency. When the crystal is vibrating, the crystal can be modeled as an RLC circuit that produces a rapidly changing reactance with frequency, with the RLC circuit providing positive feedback and gain at the resonant frequency, leading to sustained oscillations.

Although the frequency of a crystal oscillator tends to remain constant with a high degree of accuracy, aging, temperature and process variations of the crystal can lead to frequency shifts of approximately +/−30 ppm. However, some cellular standards require the frequency shift to be better than 0.01 ppm at 26 MHz. Therefore, crystal oscillators typically include some sort of frequency tuning mechanism to compensate for the inherent frequency shifts in crystal oscillators.

In many cellular applications, a digitally-controlled crystal oscillator (DCXO) is used to provide the necessary frequency tuning capabilities. DCXO's compensate for frequency errors using a combination of digital and analog circuitry. A DCXO "pulls" the crystal frequency to the desired value based on frequency measurement calculations. A digitally configurable interface can be used to programmatically add or subtract load capacitance to the oscillator circuit to change the resonance frequency of the crystal oscillator.

The load capacitance normally takes the form of a binary-weighted switched capacitor array. However, using conventional binary-weighted capacitor topology, it is difficult to obtain a 0.01 ppm frequency accuracy. Binary arrays produce code dependent glitches that are difficult to be eliminated. Since some frequency steppings are potentially much larger than 0.01 ppm, two different unit capacitors are typically required for fine frequency tuning. Using a larger unit capacitor in the fine tuning process can introduce significant glitches in the circuitry, which results in undesirable frequency variations in the oscillator output, thereby making it a challenge to arrive at monotonicity in frequency tuning. In addition, the regular layouts of traditional binary-weighted capacitor arrays have random mismatches, leading to non-monotonic frequency tuning.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

FIGS. 5-7 illustrate exemplary capacitor layout patterns of switched capacitor networks of the frequency tuning device of the present invention;

DETAILED DESCRIPTION OF THE INVENTION

Figure 1:
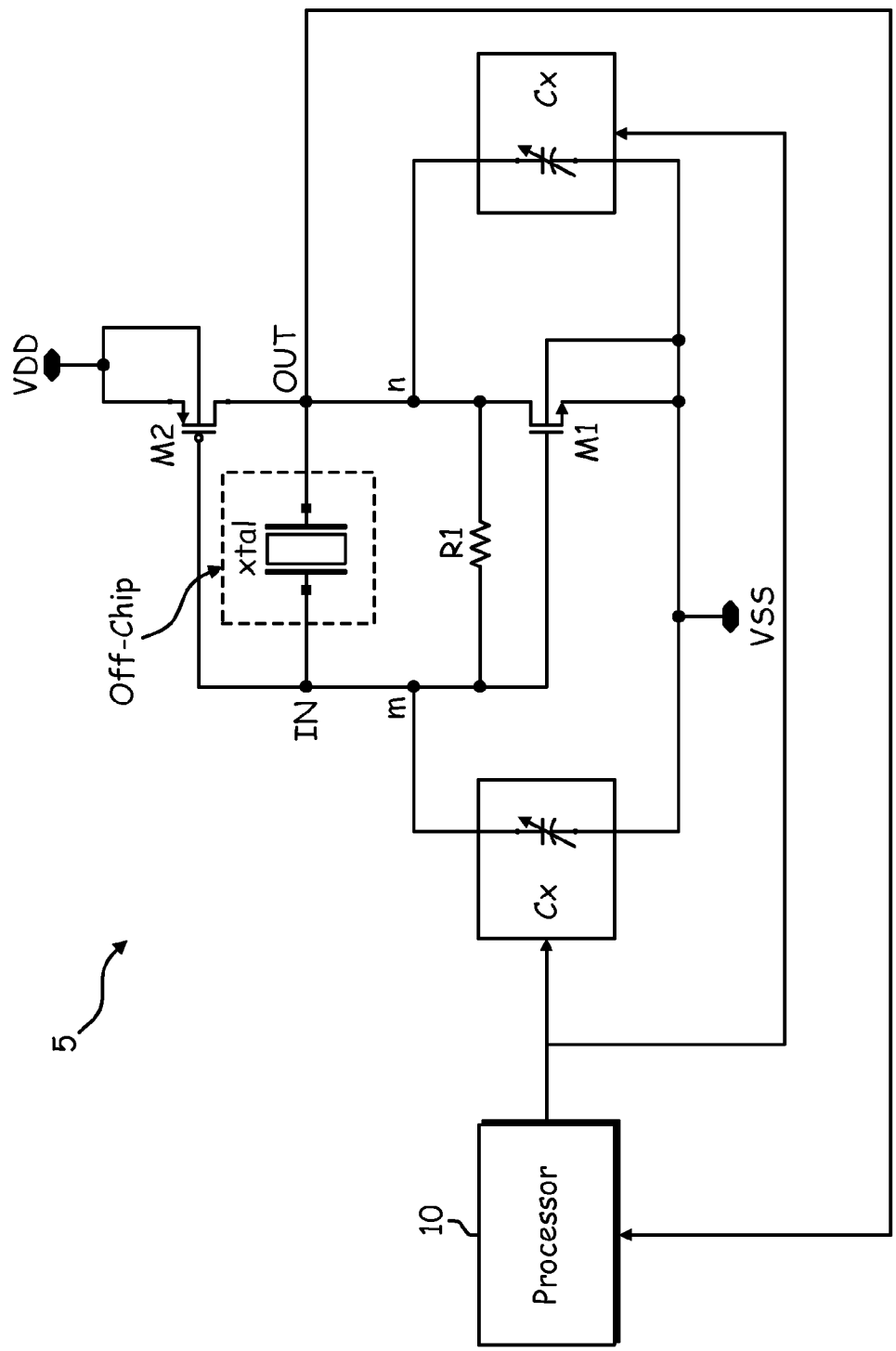
FIG. 1 is a schematic circuit diagram of an exemplary digitally-controlled crystal oscillator (DCXO) in accordance with the present invention.

FIG. 1 depicts a simplified circuit diagram of an exemplary digitally-controlled crystal oscillator (DCXO) 5, in accordance with the present invention. The DCXO 5 includes a processor 10, a resonant crystal Xtal, and an oscillator drive circuit that includes a pair of transistors M1 and M2, a resistor R1 and a pair of load capacitor arrays, both designated by Cx. The resonant crystal may be formed from a variety of resonating crystalline materials, including but not limited to, quartz and tourmaline. For example, in an exemplary embodiment, the resonant crystal is formed from a piece of quartz that is precisely cut, sized and shaped to resonate at a particular frequency.

The DCXO 5 further includes an input node IN for receiving an input signal (i.e., the output of the oscillator drive circuit) and an output node OUT for outputting an output signal (i.e., an oscillation frequency). The resonant crystal Xtal is coupled between the input node IN and the output node OUT, and is preferably mounted off-chip from the oscillator drive circuit. For example, an interconnecting lead, extending from input node IN to the resonant crystal Xtal, couples the output of the oscillator drive circuit to the input terminal of the resonant crystal Xtal, and another interconnecting lead, extending from resonant crystal Xtal towards output node OUT, couples the output of the resonant crystal Xtal to the output of the DCXO 5.

Each of the load capacitor arrays Cx is coupled between ground potential and one of the terminals of the resonant crystal Xtal to shunt the terminals of the resonant crystal Xtal to ground. In particular, one of the load capacitor arrays Cx is coupled between the input node IN and a ground supply voltage Vss and the other load capacitor array Cx is coupled between the output node OUT and the ground supply voltage Vss. Thus, the output, labeled m, of one of the load capacitor arrays Cx is coupled to the input node IN of the DCXO and the output, labeled n, of the other load capacitor array Cx is coupled to the output node OUT of the DCXO. In an exemplary embodiment, the load capacitor arrays Cx are identical switched-capacitor arrays that are used to tune the oscillation frequency of the resonant crystal Xtal. As such, the load capacitor arrays Cx operate as frequency tuning devices of the DCXO 5.

The gate of transistor M1 is coupled to the input node IN, the drain of transistor M1 is coupled to transistor M2 and to the output node OUT and the source of transistor M1 is coupled to the ground supply voltage Vss. Resistor R1 is coupled between the input node IN and the output node OUT to provide a bias resistance. The source of transistor M2 is coupled to a supply voltage Vdd to supply a bias current to the resonant crystal Xtal.

Transistors M1 and M2 provide positive feedback of the oscillation signal to drive the resonant crystal Xtal at the desired resonance frequency. Thus, the transistors M1 and M2 in combination with the load capacitor arrays Cx act as a negative resistance to cancel the loss in the crystal Xtal. However, aging, temperature and process changes in the crystal Xtal can lead to undesired frequency shifts. Therefore, the DCXO 5 compensates for such frequency errors by digitally controlling the load capacitor arrays Cx. Digital control of the load capacitor arrays Cx is provided by the processor 10. The processor 10 is coupled to the load capacitor arrays Cx to control the tuning capacitance of the load capacitor arrays Cx.

In operation, the processor 10 provides a digital code to the load capacitor arrays Cx in response to an error signal determined from the output of the DCXO 5. The digital code serves to adjust the tuning capacitance of each of the load capacitor arrays Cx to compensate for frequency errors in the DCXO output. Once the tuning capacitance of the load capacitor arrays Cx is set, the oscillator driver circuit drives the resonant crystal Xtal to oscillate at a particular frequency, as determined by the tuning capacitance of the load capacitor arrays Cx, in order to define an output oscillation signal at the output of the DCXO at node b. The output oscillation signal is suitable for use in various applications, such as phase locked loops, frequency tunable digital filters, direct digital frequency synthesizers, and the like.

Figure 2:
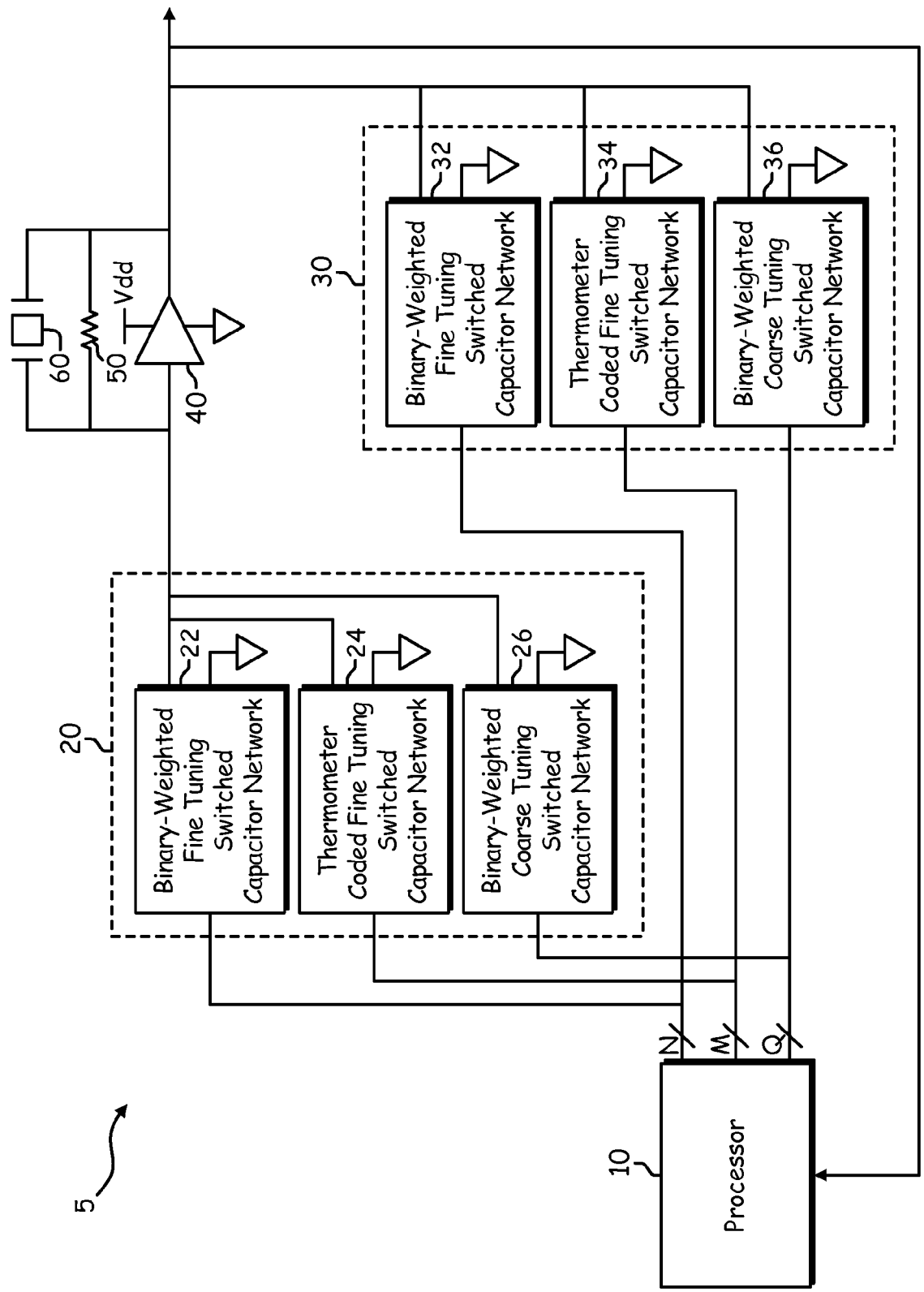
FIG. 2 is a simplified block diagram of an exemplary DCXO in accordance with the present invention.

FIG. 2 depicts a block diagram of the DCXO 5, in accordance with the present invention. The DCXO 5 includes the processor 10, frequency tuning devices 20 and 30, each corresponding to one of the load capacitor arrays Cx of FIG. 1, an amplifier 40, which corresponds to transistors M1 and M2 of FIG. 1, a resistor 50, which corresponds to resistor R1 of FIG. 1, and a resonant crystal 60, which corresponds to resonant crystal Xtal of FIG. 1. In an exemplary embodiment, the processor 10, frequency tuning devices 20 and 30, amplifier 40 and resistor 50 all reside on the same integrated circuit die. As in FIG. 1, resonant crystal 60 resides off-chip.

Each of the frequency tuning devices 20 and 30 includes a respective N-bit binary weighted switched capacitor network 22 and 32, a respective M-bit thermometer coded switched capacitor network 24 and 34 and a respective Q-bit binary weighted switched capacitor network 26 and 36. The Q-bit binary weighted switched capacitor networks 26 and 36 provide coarse tuning capability, while the N-bit binary weighted switched capacitor networks 22 and 32 and M-bit thermometer coded switched capacitor networks 24 and 34 provide fine tuning capability. Thus, the Q-bit binary weighted networks 26 and 36 may be referred to herein as the coarse tuning arrays, and the N-bit binary weighted networks 22 and 32 and M-bit thermometer coded networks 24 and 34 may be referred to herein as the fine tuning arrays.

The outputs of the N-bit binary weighted network 22, the M-bit thermometer coded network 24 and the Q-bit binary weighted network 26 are coupled in parallel to place the capacitance provided by each of them in parallel. Likewise, the outputs of the N-bit binary weighted network 32, the M-bit thermometer coded network 34 and the Q-bit binary weighted network 36 are coupled in parallel to place the capacitance provided by each of them in parallel. The resulting outputs from each of the frequency tuning devices 20 and 30 are coupled to the amplifier 40 and resistor 50 and to a respective terminal of the resonant crystal 60.

In operation, the processor 10 tunes the frequency of the resonant crystal 60 by digitally switching capacitors in and out of the frequency tuning devices 20 and 30. In particular, the processor 10 provides an input code to each of the frequency tuning devices 20 and 30 to control the tuning capacitance of each of the frequency devices 20 and 30, thereby adjusting the oscillation frequency of the resonant crystal 60. The input code is a composite N+M+Q bit input code, in which the first N bits control the binary weighted fine tuning arrays 22 and 32, the second M bits control the thermometer coded fine tuning arrays 24 and 34 and the third Q bits control the binary weighted coarse tuning arrays 26 and 36. The input code provided to each frequency tuning device 20 and 30 is identical, so that corresponding pairs of capacitors from each frequency tuning device are switched in/out together.

The output of the DCXO 5 is fed back to the processor 10. The processor 10 adjusts the input code to the frequency tuning devices 20 and 30 in order to compensate for any frequency errors in the output of the DCXO 5. By using thermometer coding in the fine frequency tuning, fine tuning on the order of 0.01 ppm can be achieved without introducing significant glitches in the frequency output, thereby enabling monotonicity in the frequency tuning. In addition, since thermometer coding typically consumes a lot of die area, by combining binary coding with thermometer coding for fine frequency tuning, the amount of silicon area needed for fine tuning is reduced.

Figure 3:
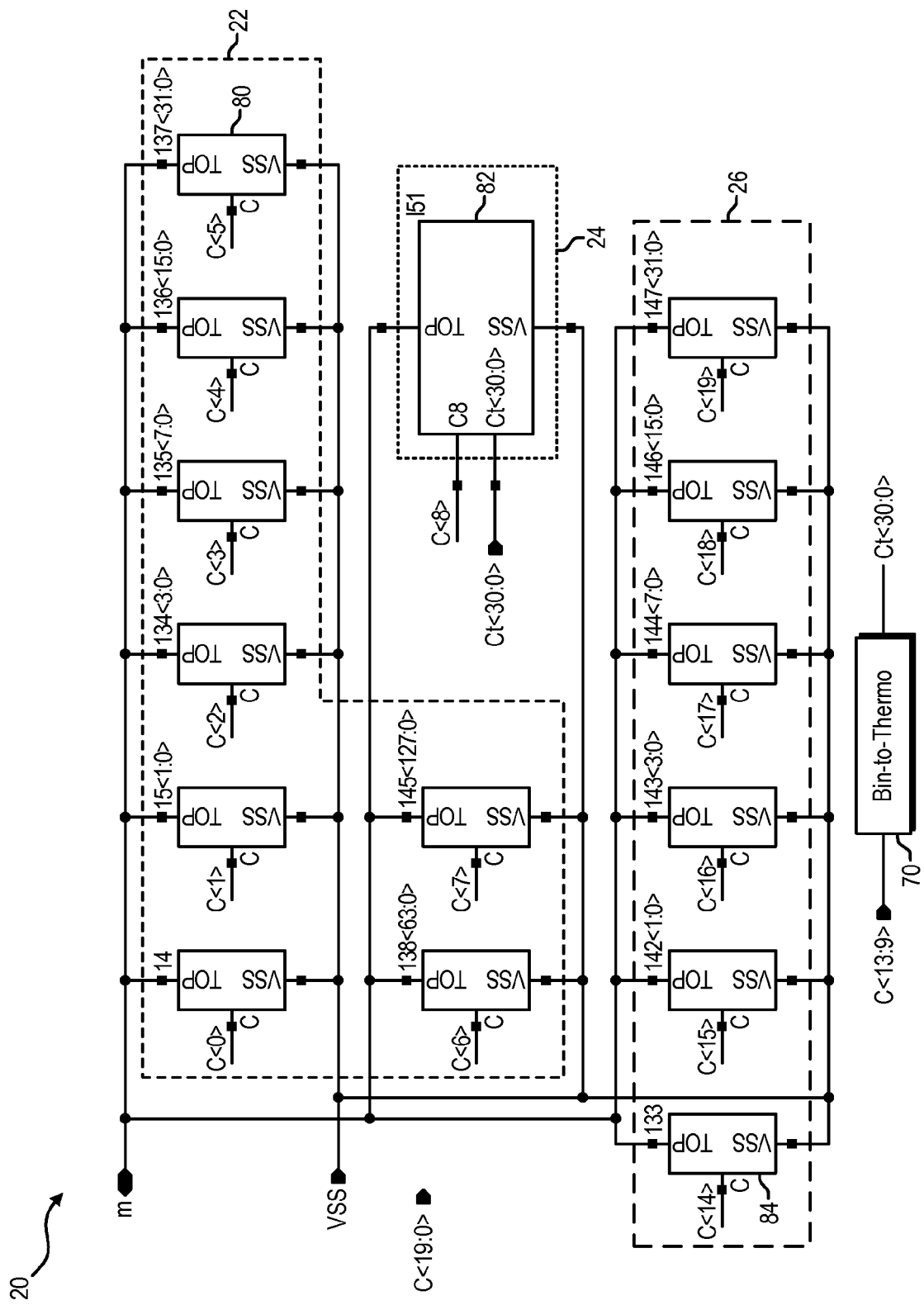
FIG. 3 is a circuit schematic illustrating an exemplary frequency tuning device of the present invention.

A more detailed view of an exemplary frequency tuning device 20 is shown in FIG. 3. The frequency tuning device 20 includes the 8-bit (bit<7:0>) binary weighted fine tuning switched capacitor network 22, the 6-bit (bit<13:8>) thermometer coded fine tuning switched capacitor network 24 and the 6-bit (bit<19:14>) binary weighted coarse tuning switched capacitor network 26. The binary weighted fine tuning switched capacitor network 22 includes a plurality of switched capacitors 80, each having the same unit capacitance value. In addition, the thermometer weighted fine tuning switched capacitor network 24 includes a plurality of switched capacitors 82, each having the same unit capacitance value. In an exemplary embodiment, the unit capacitance value of the switched capacitors 80 in the binary weighted fine tuning switched capacitor network is the same as the unit capacitance value of the switched capacitors 82 in the thermometer weighted fine tuning switched capacitor network 24.

The binary weighted coarse tuning switched capacitor network 26 also includes a plurality of switched capacitors 84, each having the same unit capacitance value. However, the unit capacitance value of the coarse tuning switched capacitors 84 is larger than the unit capacitance value of the fine tuning switched capacitors 80 and 82. For example, in an exemplary embodiment, the unit capacitance value of the fine tuning switched capacitors 80 and 82 is 0.7 fF, while the unit capacitance value of the coarse tuning switched capacitors 84 is 160 fF.

Figure 4:
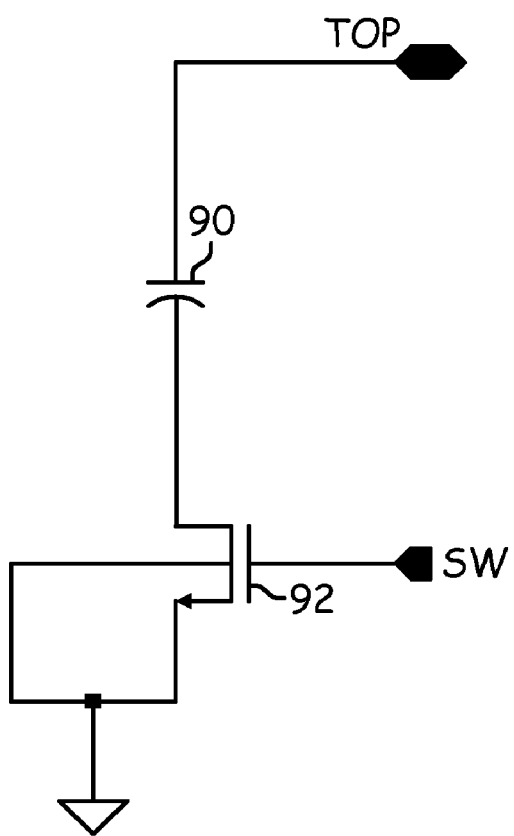
FIG. 4 is a simplified circuit diagram of an exemplary unit capacitor for use in the frequency tuning device of the present invention.

An example of a switched capacitor 80 that can be used within any of the switched capacitor networks 22, 24 and 26 is shown in FIG. 4. The switched capacitor 80 includes a unit capacitor 90 and a switching device 92, typically a metal oxide semiconductor field effect transistor (MOSFET). The switching device 92 is controlled by a digital voltage signal, or digital code. According to the digital code, the unit capacitor 90 is switched in or out to change the amount of capacitance coupled to the resonant crystal.

Referring again to FIG. 3, as a result of the binary weighting of the capacitors within the fine tuning arrays 22 and 32 and coarse tuning arrays 26 and 36, no special decode circuitry is needed to control the switched capacitors. The input code serves as the switch control for each of the switched capacitors. For example, one switched capacitor in the binary weighted fine tuning array 22 is represented by the least significant bit in the first N-bits of the input code, a set of two switched capacitors coupled in parallel in the binary weighted fine tuning array 22 is represented by the next least significant bit in the first N-bits of the input code, and so on. A desired capacitance is achieved by representing its value as a binary number and then connecting in parallel sets of capacitors corresponding to each bit in the binary number. As such, only N switched capacitors and control lines are required for an N-bit input code in order to realize $2^N$ distinct capacitance values. Likewise, only Q switched capacitors and control lines are required for a Q-bit input code in order to realize $2^Q$ distinct capacitance values.

The thermometer coded fine tuning switched capacitor network 24 includes a plurality of switched capacitors, represented generally at 82. Each switched capacitor within the thermometer coded fine tuning switched capacitor network 24 has the same unit capacitance value as the switched capacitors in the binary weighted fine tuning switched capacitor network 22. However, thermometer coded switched capacitors are accessed in groups, and therefore, the thermometer coded switched capacitor network 24 requires a binary-to-thermometer decoder 70 to convert the binary coded input digital word into a thermometer coded digital word. Due to the grouping of the switched capacitors, in order to realize $2^M$ possible distinct capacitance values for an M-bit input code, $2^M$ switched capacitors and a significant number of control lines are needed. Thus, the thermometer coded switched capacitor network 24 may consume considerably more die area to achieve the same dynamic range as that achieved by the binary weighted switched capacitor networks 22 and 26.

In operation, the processor provides the input code containing N+M+Q bits to the frequency tuning device 20. The N-bits are input to the binary-weighted fine tuning switched capacitor network 22 to switch in/out capacitors in parallel and adjust the capacitance of the binary-weighted fine tuning switched capacitor network 22. The M-bits are input to the binary-to-thermometer decoder 70 to convert the M-bit binary coded digital word into a thermometer coded digital word. The thermometer coded digital word is input to the thermometer coded fine tuning switched capacitor network 24 to switch in/out groups of capacitors in parallel and adjust the capacitance of the thermometer coded fine tuning switched capacitor network 24. The Q-bits are input to the binary-weighted coarse tuning switched capacitor network 26 to switch in/out capacitors in parallel and adjust the capacitance of the binary-weighted coarse tuning switched capacitor network 26. The outputs of the binary-weighted fine tuning switched capacitor network 22, thermometer coded fine tuning switched capacitor network 24 and binary-weighted coarse tuning switched capacitor network 26 are coupled in parallel to produce a tuning capacitance at the output, labeled m, of the frequency tuning device 20.

Turning now to FIGS. 5-7, there are illustrated exemplary capacitor layout patterns of the switched capacitor networks of the frequency tuning device of the present invention. FIG. 5 illustrates an exemplary layout pattern of the binary-weighted fine tuning switched capacitor network 22. FIG. 6 illustrates an exemplary layout pattern of the thermometer coded fine tuning switched capacitor network 24. FIG. 7 illustrates an exemplary layout pattern of the binary-weighted coarse tuning switched capacitor network 26.

In the layout of the binary-weighted fine tuning switched capacitor network 22, as shown in FIG. 5, fine tuning bits C<7:0> are placed in a particular pattern to minimize random mismatches in the tuning capacitors due to process variations. Each cell 23 within the pattern is a unit cell containing a 0.7 fF capacitor and an NMOS switch. Dummy cells are placed surrounding the layout to improve matching. Control lines, not shown, systematically run vertically and horizontally between the unit cells.

In the layout of the thermometer coded fine tuning switched capacitor network 24, as shown in FIG. 6, fine tuning bits C<13:8> are converted into thermometer coded bits and placed in a particular pattern. Each cell 25 within the pattern contains 256 unit cells, each including a 0.7 fF capacitor and an NMOS switch.

In the layout of the binary-weighted coarse tuning switched capacitor network 26, as shown in FIG. 7, coarse tuning bits C<19:14> are also placed in a particular pattern to minimize random mismatches in the tuning capacitors due to process variations. Each cell 27 within the pattern is a unit cell containing a 160 fF capacitor and an NMOS switch.

Figure 8:
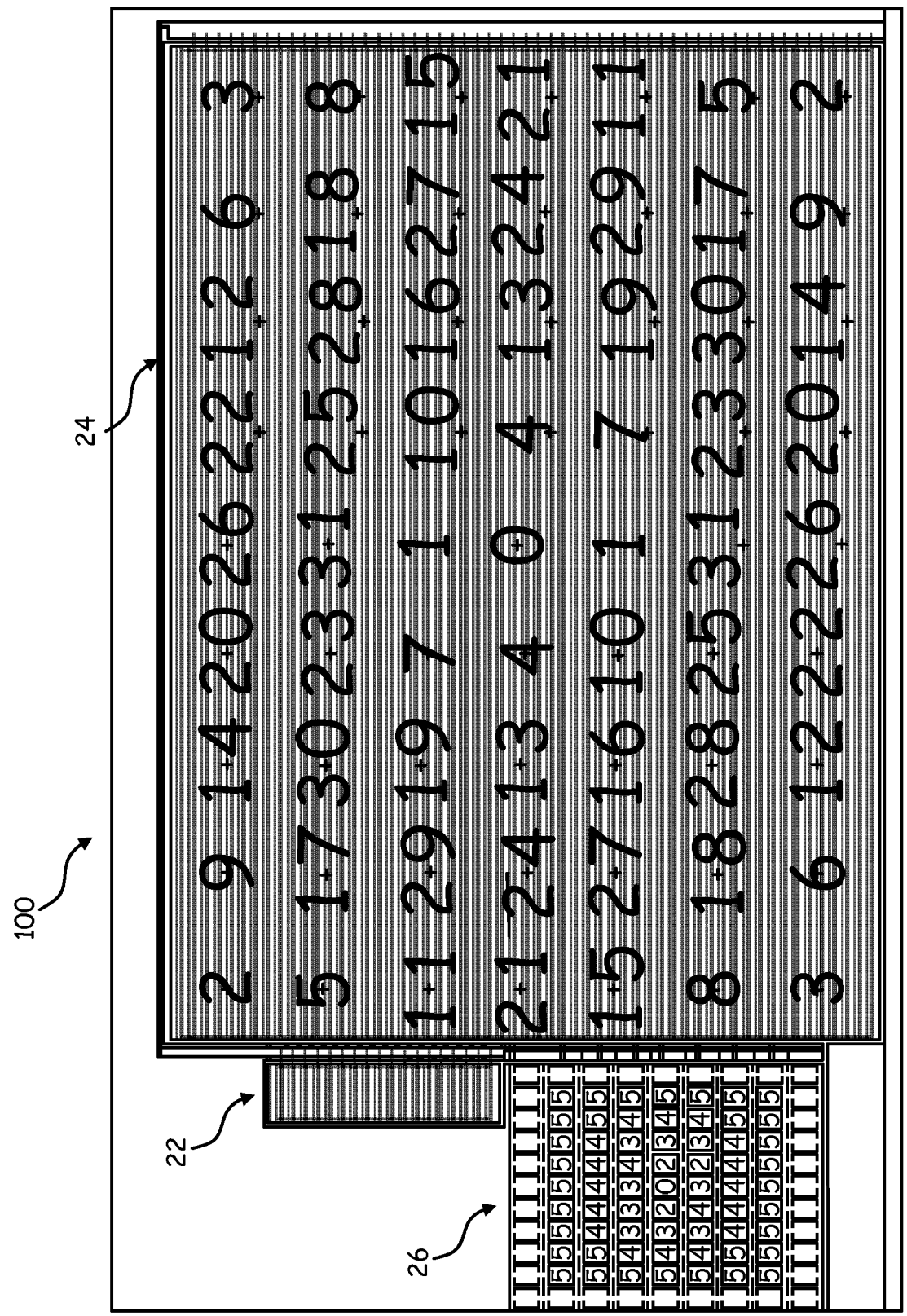
FIG. 8 illustrates an exemplary chip layout of the frequency tuning device of the present invention.

FIG. 8 illustrates an exemplary top level chip layout 100 of an exemplary frequency tuning device of the present invention. As shown in FIG. 8, the binary-weighted fine tuning switched capacitor network 22, thermometer coded fine tuning switched capacitor network 24 and binary-weighted coarse tuning switched capacitor network are all included on the same die. Although the thermometer coded fine tuning switched capacitor network 24 requires a large portion of the die space, including the thermometer coded fine tuning switched capacitor network 24 enables monotonicity of the frequency tuning with 0.01 ppm frequency accuracy. In addition, by combining the thermometer coded fine tuning switched capacitor network 24 with the binary-weighted fine tuning switched capacitor network 22, the size of the thermometer coded fine tuning switched capacitor network 24 can be minimized, thus saving silicon area.

Figure 9:
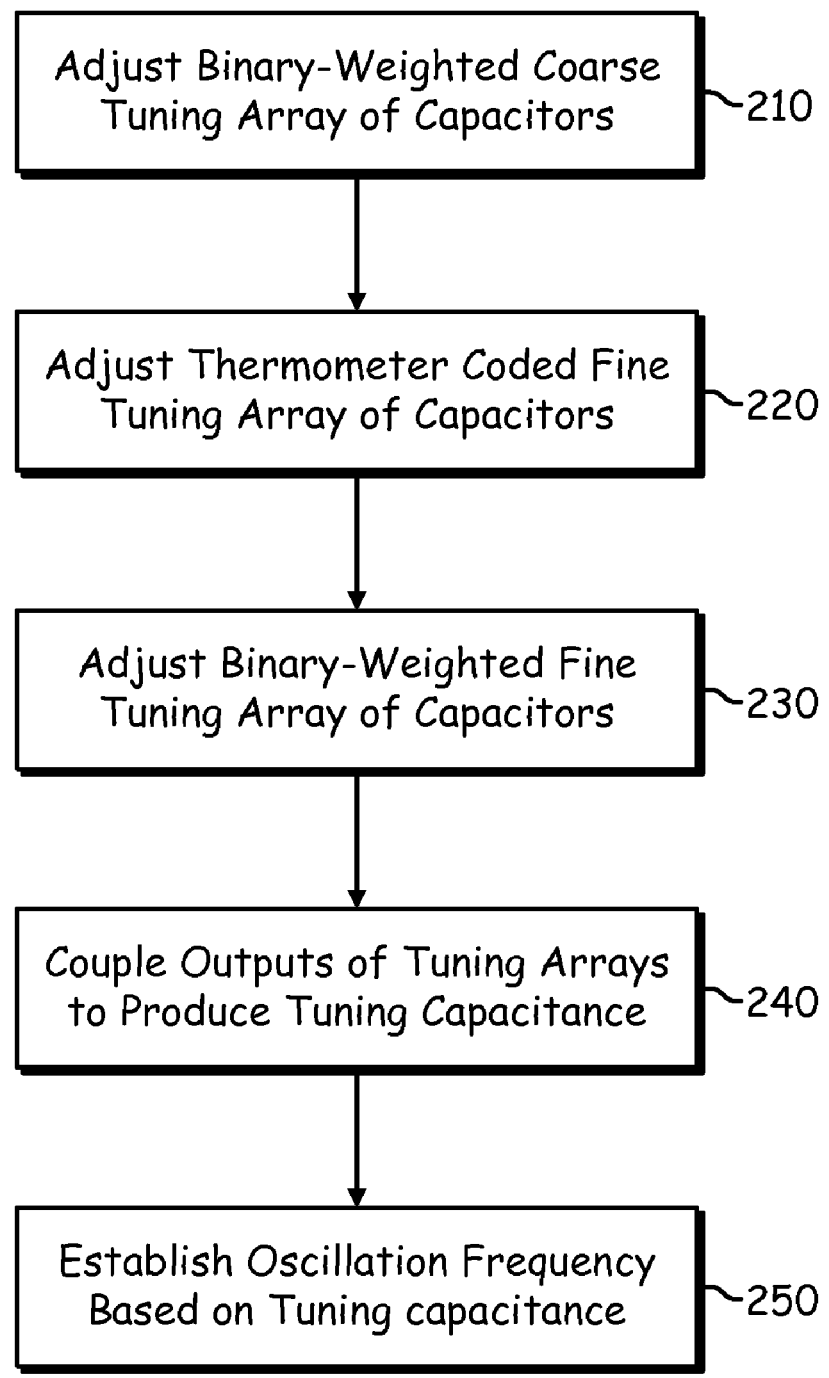
FIG. 9 is a diagram of a method for tuning a digitally controlled crystal oscillator in accordance with the present invention.

FIG. 9 is a diagram of a method for tuning a digitally controlled crystal oscillator in accordance with the present invention. The method begins at step 210, where a binary-weighted coarse tuning array of capacitors is adjusted by selectively placing capacitors within the array in parallel with each other. The method then proceeds to step 220, where a thermometer coded fine tuning array of capacitors is adjusted by selectively placing groups of capacitors within the array in parallel with each other. The method then proceeds to step 230, where a binary-weighted fine tuning array of capacitors is adjusted by selectively placing capacitors within that array in parallel with each other. At step 240, the outputs of each of the capacitor arrays are coupled in parallel to establish a tuning capacitance that is input to a crystal oscillator. The method ends at step 250, where an oscillation frequency is generated by the crystal oscillator based on the tuning capacitance.

As may be used herein, the term(s) "coupled to" and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item.

While the transistors in the above described figure(s) is/are shown as metal oxide semiconductor field effect transistors (MOSFETs), as one of ordinary skill in the art will appreciate, the transistors may be implemented using any type of transistor structure including, but not limited to, bipolar, field effect transistors (FET), N-well transistors, P-well transistors, enhancement mode, depletion mode, and zero voltage threshold (VT) transistors.

What is claimed is:

1. A frequency tuning device for use in a crystal oscillator circuit, comprising:
    a first fine tuning array of capacitors comprising an N-bit binary weighted switched capacitor network having a first plurality of switched capacitors of a first unit capacitance value;
    a second fine tuning array of capacitors comprising an M-bit thermometer coded switched capacitor network having a second plurality of switched capacitors of the first unit capacitance value; and
    a coarse tuning array of capacitors comprising a Q-bit binary weighted switched capacitor network having a third plurality of switched capacitors of a second unit capacitance value;
    wherein the first fine tuning array, the second fine tuning array and the coarse tuning array are coupled in parallel to produce a tuning capacitance;
    wherein the N-bit binary weighted switched capacitor network, the M-bit thermometer coded switched capacitor network and the Q-bit binary weighted switched capacitor network are placed in respective patterns on a single integrated circuit die to minimize random mismatches for all capacitance values.

2. The frequency tuning device of claim 1, wherein the first unit capacitance value is 0.7 fF and the second unit capacitance value is 160 fF.

3. The frequency tuning device of claim 1, wherein the first fine tuning array provides a first tuning range, the second fine tuning array provides a second tuning range and the coarse tuning array provides a third tuning range that is wider than the first tuning range and the second tuning range.

4. The frequency tuning device of claim 1, wherein the tuning capacitance produces a 0.01 ppm frequency accuracy with monotonic frequency tuning of the crystal oscillator circuit.

5. A digitally controlled crystal oscillator circuit, comprising:
    a switched capacitor network including:
        a first fine tuning array of capacitors comprising an N-bit binary weighted switched capacitor network having a first plurality of switched capacitors of a first unit capacitance value;
        a second fine tuning array of capacitors comprising an M-bit thermometer coded switched capacitor network having a second plurality of switched capacitors of the first unit capacitance value; and
        a coarse tuning array of capacitors comprising a Q-bit binary weighted switched capacitor network having a third plurality of switched capacitors of a second unit capacitance value, the first fine tuning array, the second fine tuning array and the coarse tuning array being coupled in parallel to produce a tuning capacitance;
        wherein the N-bit binary weighted switched capacitor network, the M-bit thermometer coded switched capacitor network and the Q-bit binary weighted switched capacitor network are placed in respective patterns on a single integrated circuit die to minimize random mismatches for all capacitance values;
    a processor coupled to the switched capacitor network to control the tuning capacitance produced thereby; and
    a resonant crystal coupled to establish an oscillation frequency based on the tuning capacitance.

6. The digitally controlled crystal oscillator circuit of claim 5, wherein the first unit capacitance value is 0.7 fF and the second unit capacitance value is 160 fF.

7. The digitally controlled crystal oscillator circuit of claim 5, wherein the first fine tuning array provides a first tuning range, the second fine tuning array provides a second tuning range and the coarse tuning array provides a third tuning range that is wider than the first tuning range and the second tuning range.

8. The digitally controlled crystal oscillator circuit of claim 5, wherein the processor is operable to produce a control signal for switching the switched capacitor network to vary the tuning capacitance.

9. The digitally controlled crystal oscillator circuit of claim 8, wherein the processor is further coupled to the resonant crystal in a feedback fashion to receive the oscillation frequency and is operable to produce the control signal in response to the oscillation frequency.

10. The digitally controlled crystal oscillator circuit of claim 8, wherein the control signal is a binary coded digital signal, and further comprising:
    a binary to thermometer decoder coupled to receive the binary coded digital signal from the processor and operable to convert the binary coded digital signal into a thermometer coded digital signal for use in switching the M-bit thermometer coded switched capacitor network.

11. A method for tuning a digitally controlled crystal oscillator, comprising:
    adjusting a coarse tuning array of capacitors comprising a Q-bit binary weighted switched capacitor network having a first plurality of switched capacitors of a first unit capacitance value to produce a coarse tuning output;

adjusting a first fine tuning array of capacitors comprising an M-bit thermometer coded switched capacitor network having a second plurality of switched capacitors of a second unit capacitance value to produce a first fine tuning output; and adjusting a second fine tuning array of capacitors comprising an N-bit binary weighted switched capacitor network having a third plurality of switched capacitors of the second unit capacitance value to produce a second fine tuning output;

coupling the first fine tuning output, the second fine tuning output and the coarse tuning output in parallel to produce a desired tuning capacitance; and providing the desired tuning capacitance to a resonant crystal to establish an oscillation frequency thereof;

wherein the N-bit binary weighted switched capacitor network, the M-bit thermometer coded switched capacitor network and the Q-bit binary weighted switched capacitor network are placed in respective patterns on a single integrated circuit die to minimize random mismatches for all capacitance values.

12. The method of claim 11, wherein the first unit capacitance value is 160 fF and the second unit capacitance value is 0.7 fF.

13. The method of claim 11, further comprising:

produce a control signal to vary the desired tuning capacitance, the steps of adjusting the first fine tuning array of capacitors, adjusting the second fine tuning array of capacitors and adjusting the coarse tuning array of capacitors being performed using the control signal.

14. The method of claim 13, wherein the step of producing the control signal further comprises:

receiving the oscillation frequency from the resonant crystal; and producing the control signal in response to the oscillation frequency.

15. The method of claim 14, wherein the control signal is a binary coded digital signal, and wherein the step of adjusting the first fine tuning array of capacitors further comprises:

converting the binary coded digital signal into a thermometer coded digital signal for use in switching the M-bit thermometer coded switched capacitor network.

16. The method of claim 12, wherein the coarse tuning output has a tuning range that is wider than respective tuning ranges of the first fine tuning output and the second fine tuning output.

* * * * *